United States Patent
Dolgin (10) Patent No.: US 11,391,799 B2
(45) Date of Patent: Jul. 19, 2022

(54) TUNING NETWORKS FOR SINGLE LOOP RESONATORS

(71) Applicant: RAYTHEON COMPANY, Waltham, MA (US)

(72) Inventor: Benjamin P. Dolgin, Alexandria, VA (US)

(73) Assignee: RAYTHEON COMPANY, Waltham, MA (US)

( * ) Notice: Subject to any disclaimer, the term of this patent is extended or adjusted under 35 U.S.C. 154(b) by 80 days.

(21) Appl. No.: 16/855,829

(22) Filed: Apr. 22, 2020

(65) Prior Publication Data

US 2021/0041515 A1 Feb. 11, 2021

Related U.S. Application Data

(60) Provisional application No. 62/883,850, filed on Aug. 7, 2019.

(51) Int. Cl.
| | | |
|---|---|---|
| G01R 33/36 | (2006.01) | |
| H03H 7/42 | (2006.01) | |
| H01Q 7/00 | (2006.01) | |

(52) U.S. Cl.
CPC .......... *G01R 33/3628* (2013.01); *H01Q 7/00* (2013.01); *H03H 7/42* (2013.01)

(58) Field of Classification Search
None
See application file for complete search history.

(56) References Cited

U.S. PATENT DOCUMENTS

| | | | |
|---|---|---|---|
| 6,054,856 A * | 4/2000 | Garroway | G01R 33/343 |
| | | | 324/309 |
| 9,018,575 B2 | 4/2015 | Kowalevicz et al. | |
| 9,165,963 B2 | 10/2015 | Kowalevicz et al. | |
| 9,171,219 B2 | 10/2015 | Kowalevicz | |
| 9,323,034 B2 | 4/2016 | Dolgin | |
| 9,400,414 B2 | 7/2016 | Kowalevicz | |
| 9,451,185 B2 | 9/2016 | Dolgin et al. | |
| 9,503,660 B2 | 11/2016 | Kowalevicz et al. | |
| 9,535,245 B1 | 1/2017 | Kowalevicz | |
| 9,538,096 B2 | 1/2017 | Dolgin | |
| 9,548,155 B2 * | 1/2017 | Andersson | H03H 7/0115 |
| 9,887,779 B2 | 2/2018 | Kowalevicz | |
| 9,973,281 B2 | 5/2018 | Kowalevicz et al. | |
| 10,164,765 B2 | 12/2018 | Dolgin et al. | |
| 10,177,856 B2 | 1/2019 | Kowalevicz et al. | |
| 10,205,526 B2 | 2/2019 | Kowalevicz | |
| 10,225,020 B2 | 3/2019 | Dolgin et al. | |
| 10,243,670 B2 | 3/2019 | Kowalevicz et al. | |

(Continued)

*Primary Examiner* — Douglas X Rodriguez
(74) *Attorney, Agent, or Firm* — Lando & Anastasi, LLP (57) ABSTRACT

Embodiments of an SLR antenna having differential signal contacts and a tuning circuit configured to tune the at least one resonance frequency of the SLR antenna to a predetermined operational frequency are disclosed. Embodiments of a tuning circuit include a balun transformer connected between the differential signal contacts of the SLR antenna and a single-ended input/output contact, a first variable capacitance connected between the balun transformer and the single-ended input/output contact, and a variable reactive component connected between the differential signal contacts of the SLR antenna and between differential contacts of the balun transformer.

12 Claims, 5 Drawing Sheets

(56) References Cited

U.S. PATENT DOCUMENTS

| | | |
|---|---|---|
| 10,243,673 B2 | 3/2019 | Dolgin et al. |
| 10,250,292 B2 | 4/2019 | Graceffo et al. |
| 10,256,917 B2 | 4/2019 | Dolgin et al. |
| 10,305,602 B2 | 5/2019 | Dolgin et al. |
| 10,313,022 B2 | 6/2019 | Dolgin et al. |
| 10,340,965 B2 | 7/2019 | Dolgin et al. |
| 10,374,743 B2 | 8/2019 | Dolgin et al. |
| 10,378,880 B2 | 8/2019 | Dolgin et al. |
| 10,498,464 B2 | 12/2019 | Graceffo et al. |
| 10,530,494 B2 | 1/2020 | Dolgin et al. |
| 10,554,306 B1 | 2/2020 | Graceffo et al. |
| 10,571,774 B2 | 2/2020 | Graceffo et al. |
| 10,637,580 B2 | 4/2020 | Dolgin et al. |
| 10,686,533 B2 | 6/2020 | Dolgin et al. |
| 10,714,251 B2 | 7/2020 | Dolgin et al. |
| 10,826,603 B1 | 11/2020 | Kowalevicz et al. |
| 10,924,189 B2 | 2/2021 | Kowalevicz et al. |
| 11,012,160 B2 | 5/2021 | Kowalevicz et al. |
| 11,101,896 B2 | 8/2021 | Kowalevicz et al. |
| 11,133,873 B1 | 9/2021 | Kowalevicz et al. |
| 11,159,244 B2 | 10/2021 | Graceffo et al. |
| 11,159,245 B2 | 10/2021 | Kowalevicz et al. |
| 2015/0372395 A1* | 12/2015 | Lavedas ............... H01Q 1/521 343/748 |
| 2020/0136727 A1 | 4/2020 | Graceffo et al. |
| 2020/0371328 A1 | 11/2020 | Kowalevicz et al. |
| 2020/0403709 A1 | 12/2020 | Graceffo et al. |
| 2020/0409189 A1 | 12/2020 | Graceffo et al. |
| 2021/0006336 A1 | 1/2021 | Kowalevicz et al. |
| 2021/0021351 A1 | 1/2021 | Kowalevicz et al. |
| 2021/0021449 A1 | 1/2021 | Graceffo et al. |
| 2021/0099232 A1 | 4/2021 | Graceffo et al. |
| 2021/0099234 A1 | 4/2021 | Graceffo et al. |
| 2021/0105073 A1 | 4/2021 | Graceffo et al. |
| 2021/0126715 A1 | 4/2021 | Graceffo et al. |
| 2021/0314071 A1 | 10/2021 | Graceffo et al. |

\* cited by examiner

TUNING NETWORKS FOR SINGLE LOOP RESONATORS

CROSS-REFERENCE TO RELATED APPLICATION

This application claims priority under 35 U.S.C. § 119(e) to U.S. Provisional Application Ser. No. 62/883,850, titled "TUNING NETWORK FOR SLR RESONATOR," filed on Aug. 7, 2019, which is hereby incorporated by reference in its entirety.

BACKGROUND

There are a wide variety of applications that use antennas configured to create and exploit the energy in their near-field, including, for example, RFID, nuclear magnetic resonance (NMR), nuclear quadrupole resonance (NQR), and other applications. Loop-type antennas are used for near-field interrogation applications. Loop antenna systems can be configured to effect a reduction in the creation or reception of energy in their far-field regions. That is, loop antenna systems can be designed such that the coupling between the antenna and its nearby surroundings is relatively high, whereas the coupling between the antenna and its distant surroundings is minimized. One application for near-field probes (including those using loop-type antennas) is in a detection system used to exploit a material's Nuclear Quadrupole Resonance (NQR), where NQR is a radio frequency (RF) magnetic spectroscopic technique that has been used to detect and identify of a wide range of materials based on detection of the resonances associated with their quadrupolar nuclei. The NQR response signal provides a unique signature of the material of interest, where the detected electrical signal indicates the presence of quadrupolar nuclei. Some examples of uses for NQR include (but are not limited to), screening of airline baggage, parcel screening, detection of drugs/narcotics, and detection of buried explosives.

SUMMARY OF INVENTION

Aspects and embodiments are directed to tuning networks for loop-type antennas that may extend the useful frequency range of operation of the antennas for certain applications. A shielded loop resonator (SLR) antenna circuit comprising:

Embodiments of an SLR antenna having differential signal contacts and a tuning circuit configured to tune the at least one resonance frequency of the SLR antenna to a predetermined operational frequency are disclosed. Embodiments of a tuning circuit include a balun transformer connected between the differential signal contacts of the SLR antenna and a single-ended input/output contact, a first variable capacitance connected between the balun transformer and the single-ended input/output contact, and a variable reactive component connected between the differential signal contacts of the SLR antenna and between differential contacts of the balun transformer.

Aspects and embodiments of the SLR antenna include that the operational frequency is lower than the at least one resonance frequency of the SLR antenna, and that the variable reactive component is a second variable capacitance. Aspects and embodiments of the SLR antenna include that the second variable capacitance includes a bank of switchable capacitors.

Aspects and embodiments of the SLR antenna include that the first variable capacitance includes a variable capacitor.

Aspects and embodiments of the SLR antenna include that the tuning circuit further includes a third variable capacitance connected within the SLR antenna.

Aspects and embodiments of the SLR antenna include that the tuning circuit further includes a pair of fixed-value capacitors symmetrically connected to the differential signal contacts of the SLR antenna and to ground.

Aspects and embodiments of the SLR antenna include that the at least one resonance frequency of the SLR antenna includes a first resonance frequency and a second resonance frequency, and that the operational frequency is between the first and second resonance frequencies.

Aspects and embodiments of the SLR antenna include that the operational frequency is higher than the at least one resonance frequency of the SLR antenna, and that the variable reactive component is a variable inductor. Aspects and embodiments of the SLR antenna include that the tuning circuit further includes a fixed-value capacitor connected between the differential signal contacts of the SLR antenna. Aspects and embodiments of the SLR antenna include that the tuning circuit further includes a pair of fixed-value capacitors symmetrically connected to the differential signal contacts of the SLR antenna and to ground.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

In certain applications, it is desirable to use gradiometers or other magnetic sensing devices that permit detection of very weak near-field signals without shielding. However, metallic objects that move in the near-field interfere with this capability. A shielded loop resonator (SLR) is very useful for creating an antenna that is largely insensitive to external metallic objects. However, a significant disadvantage of the SLR-based antenna and/or gradiometer is that there is a gap in range of the frequencies to which a conventional SLR tuning circuit can tune the SLR antenna. In this gap, the required values of capacitors are so low that stray capacitance of the tuning circuits, protective diodes, and other components is larger than required value of the tuning capacitor. Under most circumstances, where the system/device needs to operate in this gap range, a different antenna geometry that can be tuned to the required frequency is used. However, certain applications may require or dictate certain specific antenna geometries, making this approach inapplicable and/or using a different antenna geometry may have other drawbacks. For example, in NQR applications, the geometry of the loop antenna may be constrained by noise cancelling and sensitivity requirements. In certain instances, active electromechanical tuning of non-SLR antennas has been used; however, electromechanical tuning is slow and has limited range, which may prevent the use of this technique in certain applications.

Accordingly, aspects and embodiments provide tuning networks for SLR antennas that reduce or eliminate gaps in the tuning range of the SLR antenna, thereby extending the usefulness of the antennas for certain applications, including NQR applications.

Figure 1:
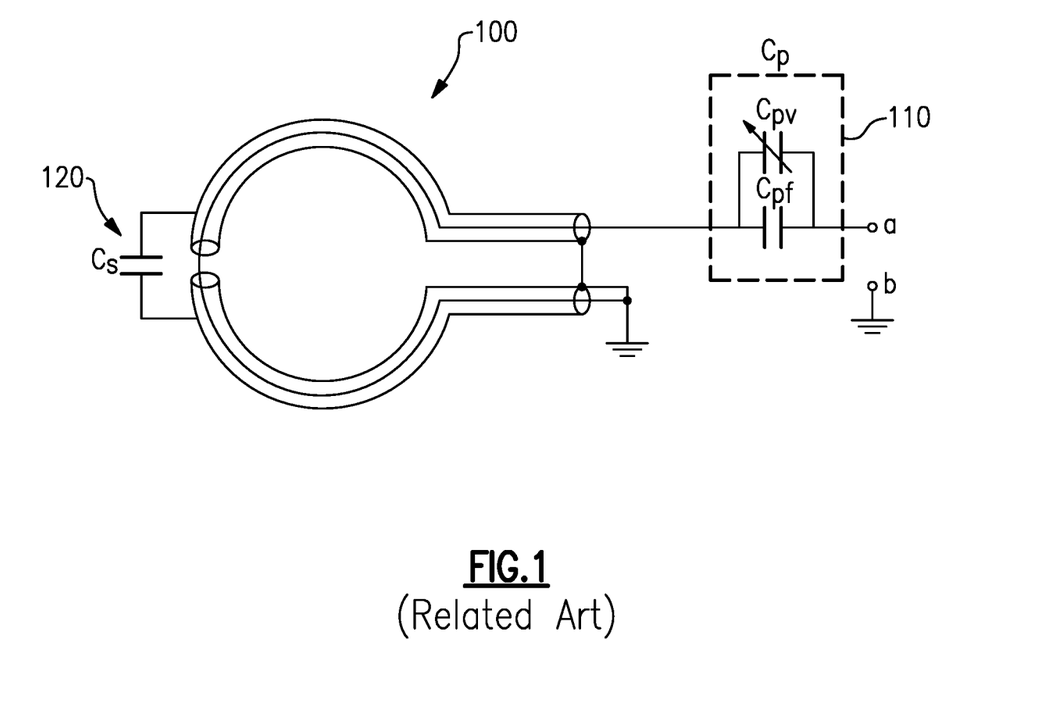
FIG. 1 is a schematic diagram of an example of a shielded loop resonator (SLR) antenna with a conventional tuning circuit.

Referring to FIG. 1, there is illustrated a schematic diagram of an example of a shielded loop resonator antenna. Generally, the SLR antenna 100 is configured as multiple coils, with the arrangement of coils being designed for particular applications. The SLR antenna can be considered as a three-conductor device, and thus as a device having three inductors (since a coiled conductor acts an inductor in RF bands). As a result, the SLR antenna has two resonances, one at a higher frequency and one at a lower frequency, and there is a gap between the two resonances. The range of frequencies within the gap may vary depending on the particular configuration of the SLR antenna 100. Conventionally, a capacitance 110 (Cp) is used to tune the operating frequency of the SLR antenna 100. As shown in FIG. 1, this tuning capacitance 110 may include a fixed capacitance (Cf) and a variable capacitance (Cv). As noted above, however, in certain instances the value of the capacitance 110 that would be needed to tune the SLR antenna into the gap between its two resonances is so low that is less than the stray capacitance 120 (Cs) associated with the device, and the desired tuning cannot be accomplished.

Accordingly, aspects and embodiments provide a tuning approach that that permits closing, or at least reducing, the frequency gap(s) in the range of SLR antenna tuning, thereby allowing the SLR antenna to be useful in a wider array of applications and circumstances. In particular, according to certain embodiments, a two-stage transformer is used to tune an SLR noise-cancelling antenna, as discussed further below. According to certain embodiments, the tuning approaches disclosed herein may be applied similarly to symmetric and asymmetric transmitter and receiver SLR antennas, as also discussed in further detail below. As noted above, an SLR antenna generally has two natural (i.e., without external tuning applied) resonance frequencies (although in some instances there is only one). In certain instances, the frequency of the high resonance can be increased with relative ease, and the frequency of the low resonance can be decreased with relative ease. In various circumstances, the high resonance can be either tuned to a desired operational frequency directly or increased above the desired operational frequency. Embodiments of the tuning circuits disclosed herein permit tuning to lower the high resonance frequency and raise the low frequency resonance, thereby reducing or closing the gap between the two. The approach is based on a recognition that at frequencies above resonance, the SLR antenna "looks" (from an impedance standpoint) more inductive, and at frequencies below resonance, the SLR antenna "looks" more capacitive. Thus, variable inductances and/or capacitances can be used to alter the impedance characteristic of the SLR antenna, making it more or less inductive depending on whether it is desired to increase or decrease the resonance frequency. In certain examples, if the desired operational frequency (i.e., the resonance to which it is desired to tune the SLR antenna for a given application) is higher than the lowest of the natural resonances, an inductive-capacitive (LC) tuning network may be used. In other examples, if the desired operational frequency is lower than the lowest of the two natural resonances, a capacitive transformer may be used for tuning. These approaches are discussed further below.

Figure 2:
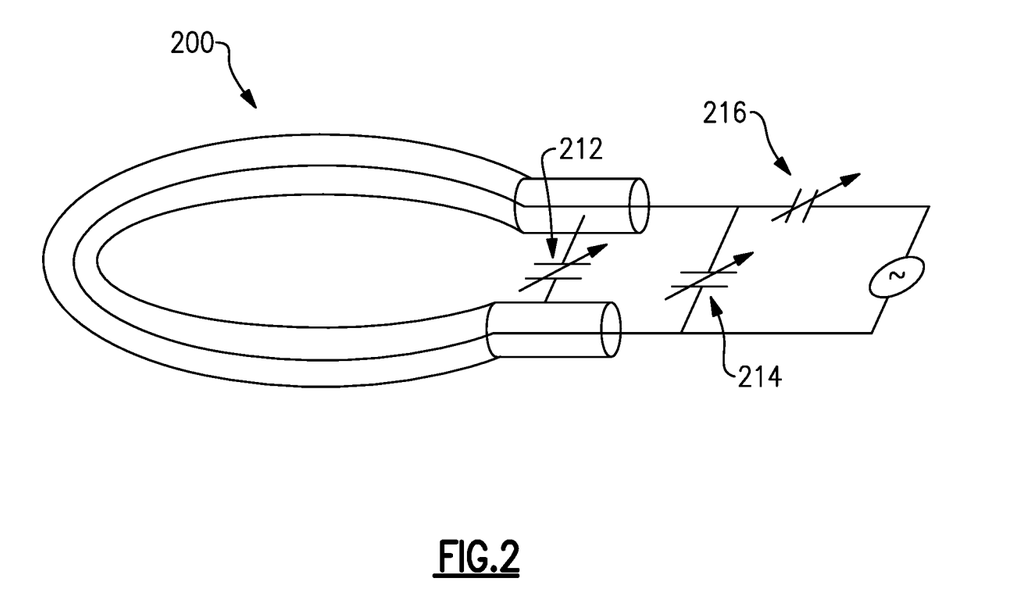
FIG. 2 is a schematic diagram of one example of an SLR antenna with a tuning circuit in an unbalanced configuration according to aspects of the present invention.
Figure 3A:
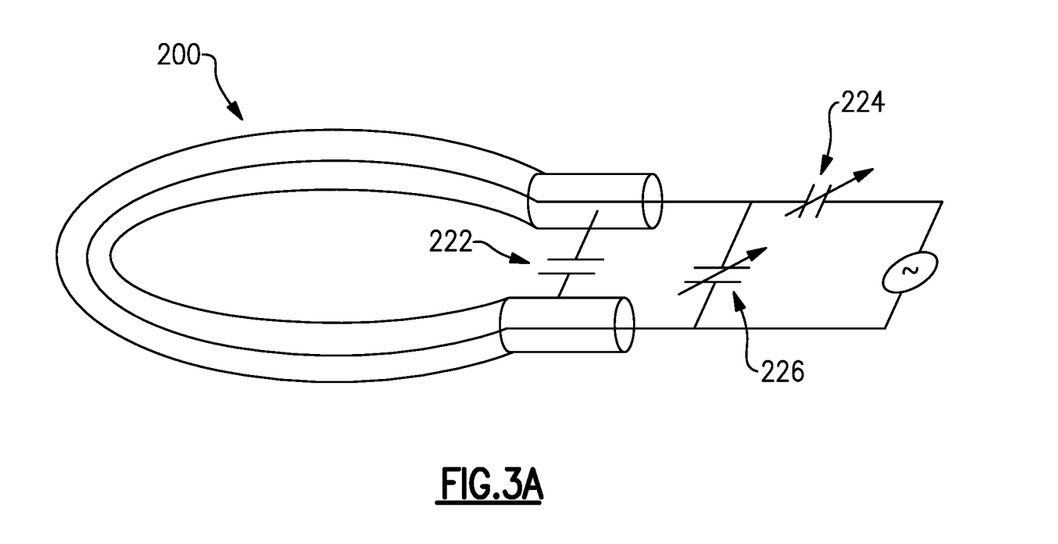
FIG. 3A is a schematic diagram of another example of an SLR antenna with a tuning circuit in an unbalanced configuration according to aspects of the present invention.
Figure 3B:
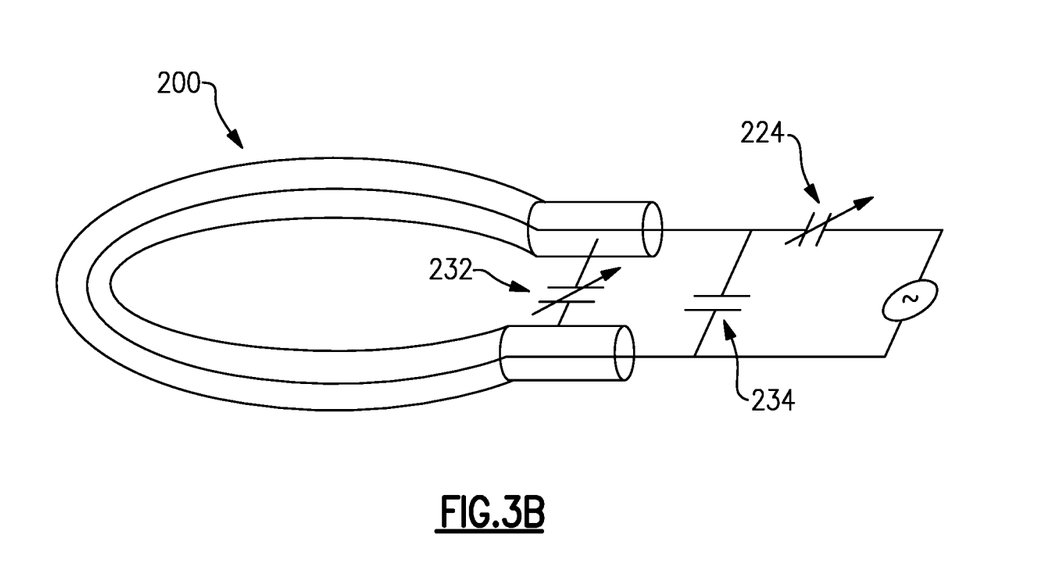
FIG. 3B is a schematic diagram of another example of an SLR antenna with a tuning circuit in an unbalanced configuration according to aspects of the present invention.

FIGS. 2 and 3A and 3B illustrate examples of an SLR antenna 200 with tuning circuits in an unbalanced configuration. Generally, these examples of tuning circuits may be applied for circumstances in which the SLR antenna 200 is used as a transmitter. In the example shown in FIG. 2, the tuning circuit includes three variable capacitances, and in the examples shown in FIGS. 3A and 3B, the tuning circuit includes two variable capacitances. The values of the variable capacitances can be adjusted to alter the amount of capacitance added to the inherent inductance of the SLR antenna to change its impedance characteristic and thereby tune a resonance to the desired operational frequency.

Referring to FIG. 2, in this example, the tuning circuit includes an arrangement of three variable capacitances 212, 214, 216 that can be individually adjusted to tune a resonance of the SLR antenna 200 to a desired operating frequency. Each of the variable capacitances 212, 214, 216 may include one or more variable (adjustable) capacitors or a bank of switchable capacitors each of a fixed value that can be selectively (using switches) connected together in various arrangements to provide an overall desired value of capacitance. By spreading the overall variable capacitance into three individually variable capacitances, a greater range of capacitance values and flexibility is achieved, allowing the tuning circuit to tune the SLR antenna over a wider range of frequencies than may be achieved with the conventional tuning circuit of FIG. 1. According to aspects and embodiments, the operating frequency can be anywhere over the tuning range of the SLR antenna and generally preferably in a middle of the tuning range. One advantages of the SLR antenna are that you can tune to a desired operating frequency. Another advantage is that the SLR retains its ability to ignore metallic objects.

Referring to FIG. 3A, in this example, the tuning circuit for the SLR antenna 200 includes a fixed capacitor 222 and two variable capacitances 224, 226. As discussed above, each of the variable capacitances 224, 226 may include one or more variable capacitors or a bank of switchable capacitors each of a fixed value that can be selectively connected together in various arrangements to provide an overall desired value of capacitance. In the example shown in FIG. 3A, the fixed capacitor 222 is connected inside the SLR antenna 200. FIG. 3B shows an alternate arrangement in which the capacitance connected inside the SLR antenna 200 is a variable capacitance 232, and a fixed capacitor 234 is used in the location of the variable capacitance 226 of FIG. 3A. Again, the variable capacitances may be 232, 234 may be implemented using variable capacitors or banks of switchable fixed-value capacitors. One advantage of the arrangement of the SLR antenna of FIG. 3A is that this embodiment is potentially easier to tune than the arrangement of FIG. 2. However, it is appreciate that both arrangements are tunable.

As discussed above, the arrangements of the SLR antenna 200 and the tuning circuits shown in FIGS. 2, 3A, and 3B are unbalanced; however, in many applications it is preferable to use the SLR antenna 200 in a balanced configuration. Accordingly, FIGS. 4A-C and FIGS. 5A and 5B illustrate balanced circuit examples with various grounding arrangements. In these examples a balun (balanced-unbalanced) transformer 310 is used to convert the differential input/output of the SLR antenna 200 to a single-ended signal contact 320. The balun transformer 310 is connected between differential signal contacts of the SLR antenna and the single-ended input/output contact 320, and shown in FIGS. 4A-C, 5A, and 5B.

Figure 4A:
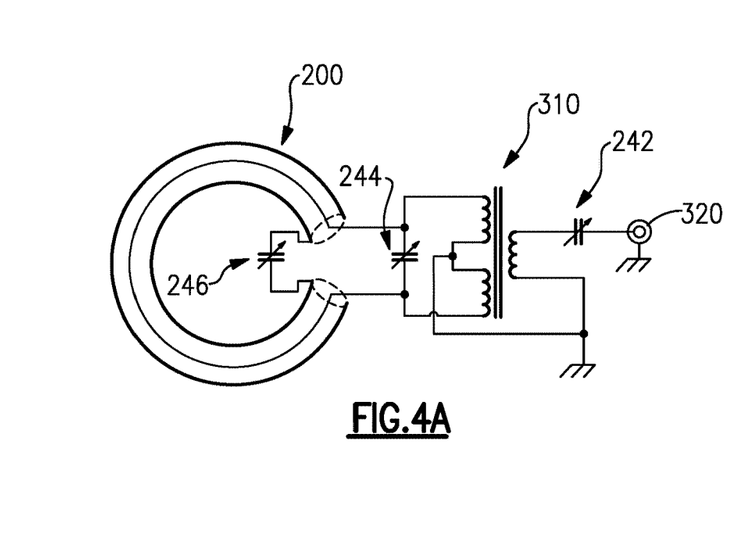
FIGS. 4A-4C are schematic diagrams illustrating examples of an SLR antenna with a tuning circuit in a balanced configuration according to aspects of the present invention.
Figure 4B:
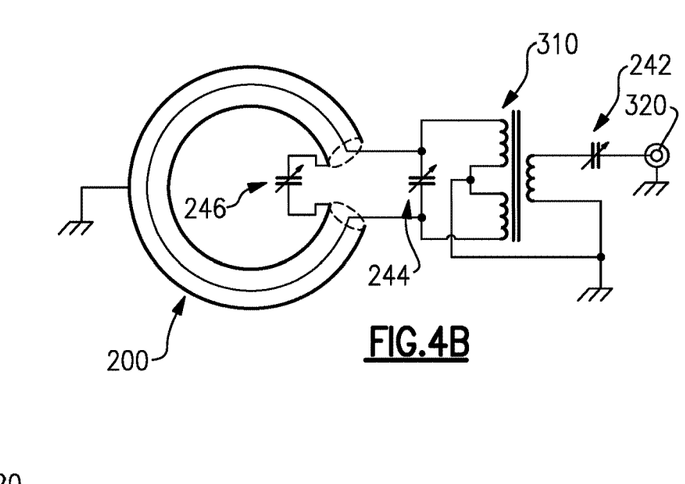
Figure 4C:
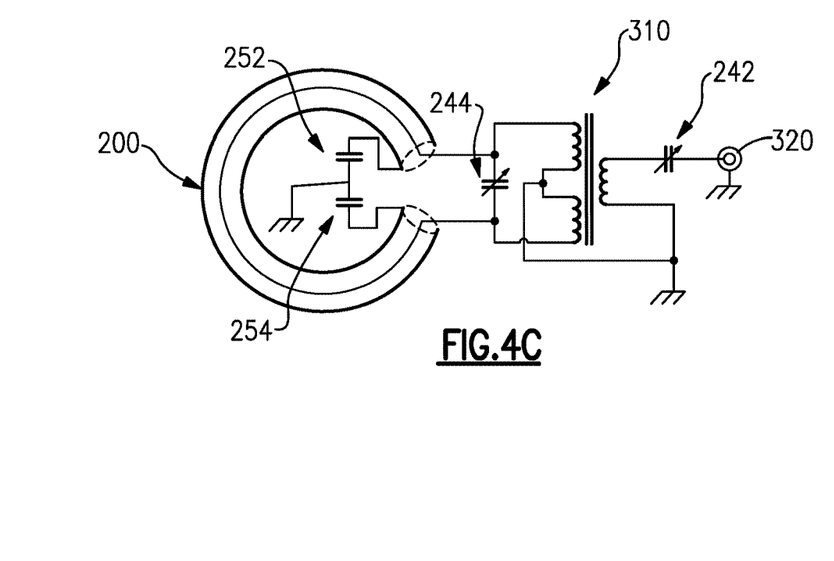

FIGS. 4A-4C illustrate examples of tuning circuit arrangements that can be used when the natural resonance(s) of the SLR antenna 200 are higher than the desired operational frequency. Thus, the tuning circuit is used to lower the resonance frequency to the desired value/range. These examples are suitable for SLR antennas used in receives and low-power transmitters. Referring to FIGS. 4A and 4B, in these examples, the tuning circuit includes a first variable capacitance 242 connected on the single-ended side of the balun transformer 310 and a second variable capacitance 244 connected on balanced/differential side of the balun transformer 310. The tuning circuit further includes a third variable capacitance 246 connected within the SLR antenna 200 between the differential signal contacts of the SLR antenna. In certain examples the second variable capacitance 244 may be used for "course" tuning, and therefore may include a bank of a plurality of switchable capacitors to allow large values of capacitance, and large variation in the values of capacitance, to be achieved. As discussed above, the plurality of the capacitors in the bank may each have a fixed value and may be connected together in a variety of arrangements (combinations of series and parallel connections, for example) using switches. In certain examples, the second variable capacitance 244 may include a bank of two or three switchable capacitors; however, in other examples, the bank may include more than three switchable capacitors. The values of the capacitors within the bank may be selected based on known natural resonance(s) of the SLR antenna 200, for example. The first variable capacitance 242 may be used for "fine" tuning, and therefore, in some examples may be implemented using a variable capacitor to allow for very small/fine changes in the capacitance value to be achieved. In certain examples, the balun transformer 310 may be a reducing transformer that lowers the voltage on capacitor 242. The third variable capacitance 246 may provide additional tuning flexibility. The only difference between the examples shown in FIGS. 4A and 4B is the grounding of the outer shield of the SLR antenna 200 shown in FIG. 4B. FIG. 4C shows a variation of the example of FIG. 4A in which the third variable capacitance 246 is replaced with a pair of fixed-value capacitors 252, 254 symmetrically connected between the differential signal contacts of the SLR antenna 200 and to ground. The split capacitor 252, 254 reduces requirements on grounding associated with the balun and, in some circumstances may permit removal of the grounded balun from the coils on the antenna side completely. It is appreciated that these arrangements are important when the influence of stray capacitances and coupling is an issue.

Figure 5A:
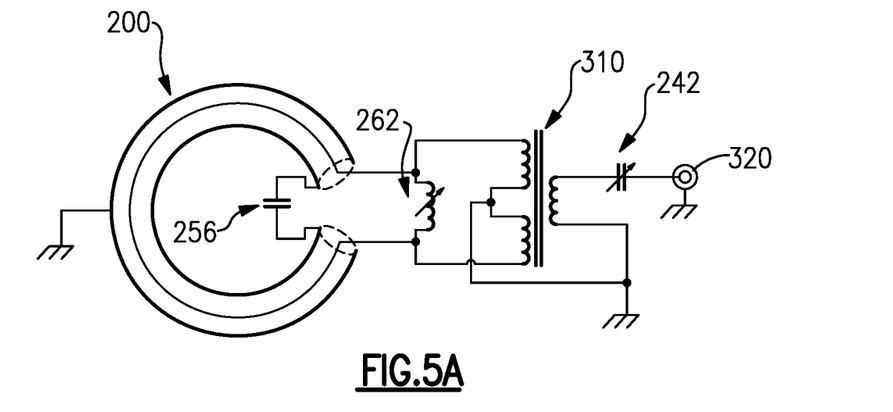
FIG. 5A is a schematic diagram of another example of an SLR antenna with a tuning circuit in a balanced configuration according to aspects of the present invention.
Figure 5B:
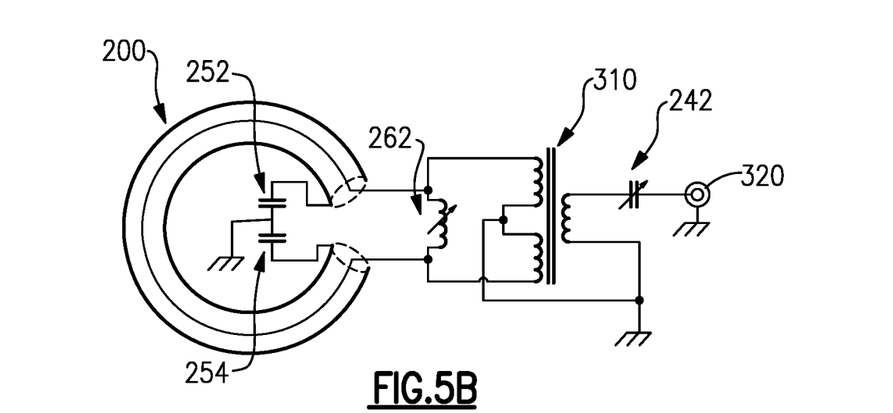
FIG. 5B a schematic diagram of another example of an SLR antenna with a tuning circuit in a balanced configuration according to aspects of the present invention.

FIGS. 5A and 5B illustrate examples of tuning circuit arrangements than can be used when the natural resonance(s) of the SLR antenna 200 are lower that the desired operational frequency. In both examples, the second variable capacitance 244 of FIGS. 4A-C is replaced with a variable inductor 262. These examples may be suitable for applications in which the SLR antenna is used as a transmitter. In transmitter applications, it may be difficult to implement variable capacitors; however, the variable inductor 262 may be implemented with relative ease. In circumstances where the natural resonance(s) of the SLR antenna 200 are too low for the desired application, the SLR antenna 200 "looks" like a capacitor (from an impedance standpoint), and therefore a variable inductance is needed to tune the resonance to the desired operational frequency. Thus, in these examples, as discussed above, the tuning circuit includes an LC circuit, including the variable inductance 262 and the variable capacitance 242. FIGS. 5A and 5B show two grounding variations for the circuit. In the example of FIG. 5A, a fixed capacitor 256 is included within the SLR antenna 200 and connected between the differential signal contacts of the SLR antenna 200, and the outer shielding loop of the SLR antenna is grounded. In the example of FIG. 5B, the circuit includes the pair of fixed-value capacitors 252, 254 symmetrically connected between the differential signal contacts of the SLR antenna 200 and to ground, similar to the example of FIG. 4C.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, it is to be appreciated that embodiments of the methods and apparatuses discussed herein are not limited in application to the details of construction and the arrangement of components set forth in the foregoing description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Accordingly, the foregoing description and drawings are by way of example only, and the scope of the invention should be determined from proper construction of the appended claims, and their equivalents.

What is claimed is:

1. A shielded loop resonator (SLR) antenna circuit comprising:
an SLR antenna having differential signal contacts and at least one resonance frequency; and a tuning circuit configured to tune the at least one resonance frequency of the SLR antenna to a predetermined operational frequency, the tuning circuit including a balun transformer connected between the differential signal contacts of the SLR antenna and a single-ended input/output contact, a first variable capacitance connected between the balun transformer and the single-ended input/output contact, and a variable reactive component connected between the differential signal contacts of the SLR antenna and between differential contacts of the balun transformer.

2. The SLR antenna circuit of claim 1 wherein the operational frequency is lower than the at least one resonance frequency of the SLR antenna, and wherein the variable reactive component is a second variable capacitance.

3. The SLR antenna circuit of claim 2 wherein the second variable capacitance includes a bank of switchable capacitors.

4. The SLR antenna circuit of claim 3 wherein the first variable capacitance includes a variable capacitor.

5. The SLR antenna circuit of claim 2 wherein the tuning circuit further includes a third variable capacitance connected within the SLR antenna.

6. The SLR antenna circuit of claim 2 wherein the tuning circuit further includes a pair of fixed-value capacitors symmetrically connected to the differential signal contacts of the SLR antenna and to ground.

7. The SLR antenna circuit of claim 1 wherein the at least one resonance frequency of the SLR antenna includes a first resonance frequency and a second resonance frequency, and wherein the operational frequency is between the first and second resonance frequencies.

8. The SLR antenna circuit of claim 1 wherein the operational frequency is higher than the at least one resonance frequency of the SLR antenna, and wherein the variable reactive component is a variable inductor.

9. The SLR antenna circuit of claim 8 wherein the tuning circuit further includes a fixed-value capacitor connected between the differential signal contacts of the SLR antenna.

10. The SLR antenna circuit of claim 8 wherein the tuning circuit further includes a pair of fixed-value capacitors symmetrically connected to the differential signal contacts of the SLR antenna and to ground.

11. The SLR antenna circuit of claim 1 wherein the single-ended input/output contact is connected between ground and the first variable capacitance.

12. A shielded loop resonator (SLR) antenna circuit comprising:
an SLR antenna having differential signal contacts and at least one resonance frequency; and
a tuning circuit configured to tune the at least one resonance frequency of the SLR antenna to a predetermined operational frequency, the tuning circuit including a balun transformer connected between the differential signal contacts of the SLR antenna and a single-ended input/output contact, a first variable capacitance connected between the balun transformer and the single-ended input/output contact, and a variable reactive component connected between the differential signal contacts of the SLR antenna and between differential contacts of the balun transformer, the tuning circuit including a pair of fixed-value capacitors symmetrically connected to the differential signal contacts of the SLR antenna and to ground, and
wherein the operational frequency is lower than the at least one resonance frequency of the SLR antenna and the variable reactive component is a second variable capacitance, or
wherein the operational frequency is higher than the at least one resonance frequency of the SLR antenna and the variable reactive component is a variable inductor.

* * * * *